United States Patent
Jones et al.

(10) Patent No.: US 7,671,341 B2
(45) Date of Patent: Mar. 2, 2010

(54) MULTI COLOUR PHOTON DETECTORS

(75) Inventors: Christopher Laurence Jones, Eastleigh (GB); Leslie George Hipwood, Christchurch (GB); Christopher David Maxey, Romsey (GB); Ian Martin Baker, Romsey (GB)

(73) Assignee: Selex Sensors and Airborne Systems Limited, Essex (GB)

( * ) Notice: Subject to any disclaimer, the term of this patent is extended or adjusted under 35 U.S.C. 154(b) by 604 days.

(21) Appl. No.: 11/658,582

(22) PCT Filed: Nov. 24, 2006

(86) PCT No.: PCT/GB2006/050415

§ 371 (c)(1),
(2), (4) Date: Jan. 26, 2007

(87) PCT Pub. No.: WO2007/068970

PCT Pub. Date: Jun. 21, 2007

(65) Prior Publication Data

US 2009/0001278 A1    Jan. 1, 2009

(30) Foreign Application Priority Data

Dec. 14, 2005  (EP) ................................. 05270090
Dec. 14, 2005  (GB) ................................. 0525392.7

(51) Int. Cl.
  *G01T 1/24*    (2006.01)
(52) U.S. Cl. ................................. 250/370.01
(58) Field of Classification Search ............ 250/370.01, 250/370.13, 330
See application file for complete search history.

(56) References Cited

U.S. PATENT DOCUMENTS

| 5,113,076 | A | * | 5/1992 | Schulte .................... 250/370.06 |
| 5,149,956 | A | * | 9/1992 | Norton ........................ 257/188 |
| 5,380,669 | A | * | 1/1995 | Norton ......................... 438/74 |
| 5,583,338 | A | * | 12/1996 | Goodwin ................. 250/338.4 |
| 5,959,339 | A | * | 9/1999 | Chapman et al. ............ 257/440 |
| 6,013,912 | A | * | 1/2000 | Pautrat et al. ............... 250/226 |
| 6,049,116 | A | * | 4/2000 | Park et al. .................... 257/442 |
| 6,455,908 | B1 | * | 9/2002 | Johnson et al. ............. 257/440 |
| 6,469,358 | B1 | | 10/2002 | Martin |
| 2005/0045910 | A1 | * | 3/2005 | Taylor et al. ................. 257/184 |
| 2006/0118722 | A1 | * | 6/2006 | Pham ...................... 250/338.4 |

FOREIGN PATENT DOCUMENTS

| EP | 0 797 256 A2 | 9/1997 |
| EP | 0 797 256 A3 | 8/1998 |
| WO | WO 00/77861 A1 | 12/2000 |
| WO | WO 2005/122261 A1 | 12/2005 |

* cited by examiner

OTHER PUBLICATIONS

Reine M B et al: "Independently Accessed Back-to-Back HGCDTE Photodiodes: A New Dual-Band Infrared Detector" Journal of Electronic Materials, Warrendale, PA, US, vol. 24, No. 5, May 1, 1995, pp. 669-679, XP000646656 *the whole document*.

*Primary Examiner*—David P Porta
*Assistant Examiner*—Djura Malevic
(74) *Attorney, Agent, or Firm*—Buchanan Ingersoll & Rooney PC

(57) ABSTRACT

Described herein is a multi-color radiation detector that comprises a mesa-type multi-layered mercury-cadmium-telluride detector structure monolithically integrated on a substrate. The detector is responsive to three or more discrete wavelength ranges and means is provided whereby each of the wavelength ranges can be detected independently or in combination with others of the ranges.

13 Claims, 4 Drawing Sheets

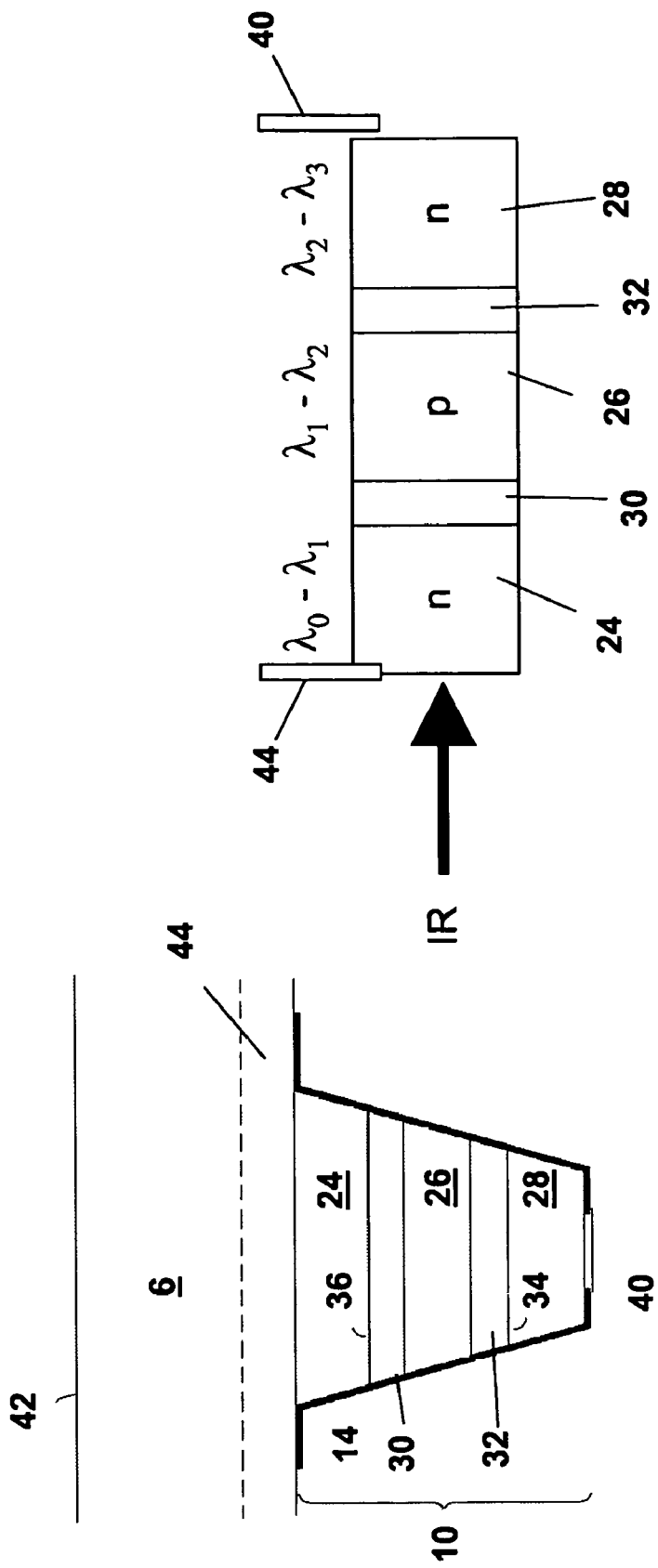

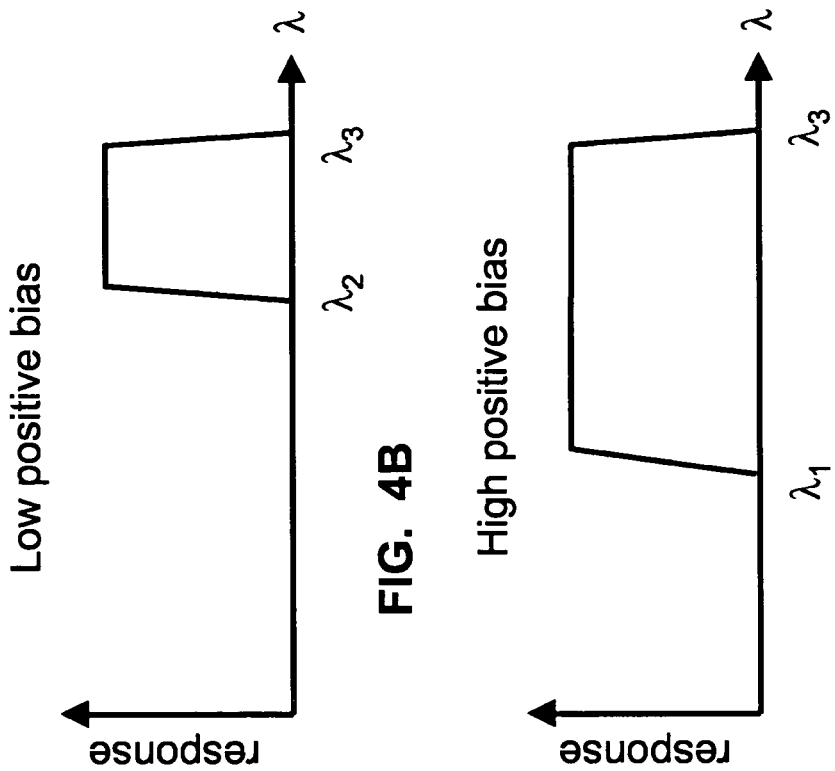
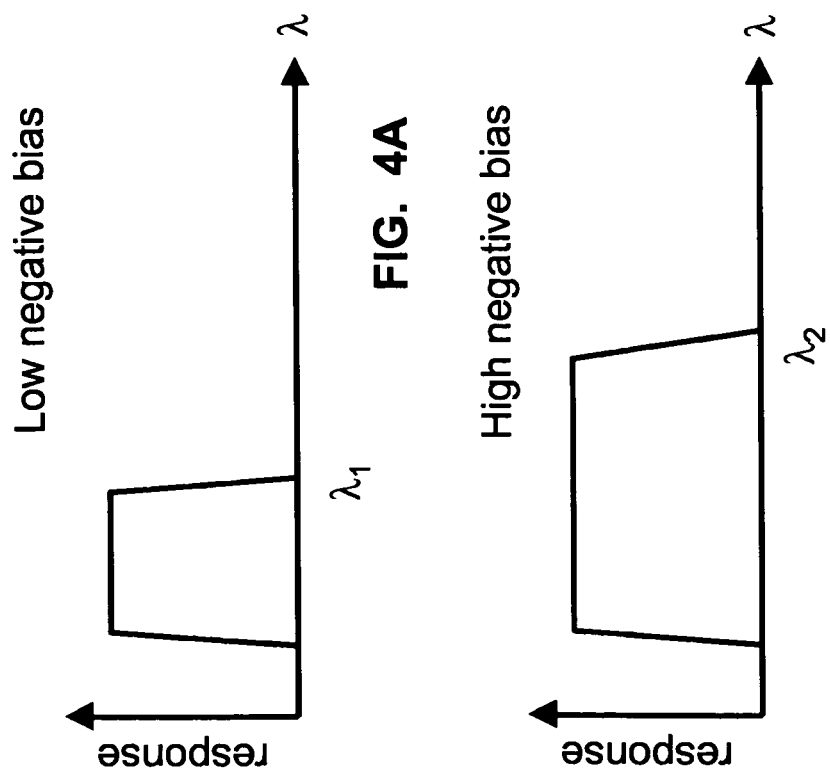
FIG. 4A  Low negative bias
FIG. 4B  Low positive bias
FIG. 4C  High negative bias
FIG. 4D  High positive bias

MULTI COLOUR PHOTON DETECTORS

CROSS REFERENCE TO RELATED APPLICATIONS

This application claims priority under 35 U.S.C. §119 to British Application 0525392.7 filed in Great Britain on 14 Dec. 2005, European Application 05270090.3 filed in European Patent Office on 14 Dec. 2005, and is a US national phase application of PCT/GB2006/050415 filed as an International Application on 24 Nov. 2006 designating the U.S., the entire contents of which are hereby incorporated by reference in their entireties.

FIELD

The present invention relates to multi-colour photon detectors, and is particularly concerned with detectors that are capable of detecting radiation in at least three wavelength bands.

BACKGROUND INFORMATION

High performance, infrared photon detectors are commonly made from the narrow bandgap semiconductor mercury-cadmium-telluride (HgCdTe) which generates electron-hole pairs when struck by infrared radiation. In this material, the bandgap is dependent on the ratio of cadmium to mercury. For example, a detector made from $Hg_{1-x}Cd_xTe$ with x=0.3 would respond, at a temperature of 80K, to all wavelengths up to 5 µm. In practice a lower limit is set, either intentionally or unintentionally, by the presence of some other component in the optical path. For example, the lower limit could be set by using an optical filter that cut-on at 3 µm so that the combination of filter and detector would then respond to all wavelengths between 3 µm and 5 µm. Such a conventional detector gives a signal proportional to the integrated photon flux in the wavelength band. However, the spectral distribution of emissions from a source can give information about the source and many applications require the ability to image a scene at infrared wavelengths in two or more different spectral bands, a capability commonly called, where two spectral bands are used, "dual colour thermal imaging". Such applications include rejection of background clutter, target discrimination and remote sensing for temperature determination and pollution monitoring.

Such dual-band HgCdTe detector arrays comprise two separate photovoltaic detectors within each unit cell, one on top of the other. The photodiode with the shorter cut-off wavelength acts as a long-wavelength-pass filter for the longer cut-off photodiode. The use of two spatially coincident detectors that respond in different wavelength bands, the so-called two-colour detector, gives useful information about the source.

There are two principal types of HgCdTe two-colour detectors-the metal-insulator-semiconductor (MIS) heterojunction detector and the triple layer heterojunction diode. The MIS heterojunction includes a thin wide bandgap n-type layer over a thick narrow bandgap n-type layer. The structure can detect radiation consistent with the wide bandgap layer or wide plus narrow bandgap layer, depending upon the voltage across the layers. However this structure requires precise control of both the layer thickness and the carrier concentration. It also only detects narrow and wide bandgap radiation separately.

The triple layer heterojunction diode includes back-to-back n-p-n diodes, one photodiode of long wavelength, LW, the other of mid wavelength, MW, for example. Operated by biasing between two terminals, one bias polarity results in the top (long wavelength, LW) photodiode of the bias-selectable detector being reverse-biased. The photocurrent of the MW photodiode is shunted by the low impedance of the forward-biased MW photodiode and the only photocurrent to emerge in the external circuit is the LW photocurrent. When the bias voltage is reversed, the situation reverses. The LW photodiode is then forward-biased and the MW photodiode is reverse-biased. In this case the LW photocurrent is shunted and only the MW photocurrent is seen in the external circuit. This provides detection in two adjacent wavebands within each unit cell, with the optical areas of the two photodiodes spatially registered and co-located. Such co-location improves the accuracy of any calculation which assumes a single source for the two wavelengths of radiation. Even though the bias-selectable dual-band HgCdTe detector affords spatial co-location of the two detectors, it does not allow temporal simultaneity of detection. Either one or other of the photodiodes is functioning, depending on the bias polarity applied across the back-to-back diode pair. Other problems also arise from the fact that it does not allow independent selection of the optimum bias for each photodiode and that there can be substantial MW cross-talk in the LW detector.

Some applications require simultaneity of detection in the two spectral bands. This has been achieved in an independently accessible two-colour IR detector, which provides independent electrical access to each of two spatially co-located back-to-back photodiodes. The p-n-n-p structure was formed by two $Hg_{1-x}Cd_xTe$ layers grown sequentially onto a cadmium-zinc-telluride, CdZnTe, substrate.

However, previously available two-colour detectors are responsive in two overlapping wavelength bands. There is a need for two-colour detectors that respond in two non-adjacent wavelength bands, i.e. a detector in which two wavelength bands produce a signal, the two wavelength bands being separated by a wavelength band that does not produce a signal.

In our co-pending UK patent application no. 0412942.5 and international patent application no. PCT/GB2005/050083 there is disclosed an electromagnetic radiation detector that is responsive to two discrete wavelength ranges, thus allowing the response of the detector to be matched to discrete atmospheric transmission windows that are separated by wavelength bands in which infrared radiation does not easily propagate. Complete separation or large spacing of the detection bands leads to an improved ability to characterise the temperature or wavelength of an external source, enabling machine intelligence to make a better assessment of the physical nature of the source. Applications of such a detector include clutter rejection and target identification. The detector described in the UK patent application above comprises a plurality of layers of semiconductor material formed on a substrate substantially transparent to electromagnetic radiation having wavelengths in a desired wavelength range. A first layer, doped to provide a first type of electrical conductivity, has a bandgap selected for absorbing radiation up to a first wavelength; a second layer, doped to provide a second type of electrical conductivity, has a bandgap selected for absorbing radiation up to a second wavelength that is longer than the first wavelength; and a third layer, doped to provide the first type of electrical conductivity, has a bandgap selected for absorbing radiation up a third wavelength that is longer than the second wavelength. Sandwiched between these absorbing layers are thin barrier layers that are doped to provide the same type of electrical conductivity as the second layer but have a bandgap substantially greater than the second layer.

The purpose of these barrier layers is to prevent minority carriers generated in the second layer from reaching the junctions; instead they recombine with majority carriers in the second layer. Thus radiation with wavelengths between the first and second wavelengths will not give rise to a signal in the external circuit.

SUMMARY

It has been found that the general structure described in the patent application described above can be extended to permit detection of three or more colours.

According to one aspect of the present invention, there is provided an electromagnetic radiation detector responsive to n discrete wavelength ranges, where n is odd and greater than or equal to 3, characterised as $\lambda_0$-$\lambda_1$, $\lambda_1$-$\lambda_2$, ..., $\lambda_{n-1}$-$\lambda_n$ within a total wavelength range $\lambda_0$-$\lambda_n$ where $\lambda_0 < \lambda_1 < \lambda_2 < ... \lambda_{n-1} < \lambda_n$, the detector comprising a plurality of layers of semiconductor material providing:

a substrate substantially transparent to electromagnetic radiation within said wavelength range $\lambda_0$-$\lambda_n$;

a first sequence of layers, each doped to provide a first type of electrical conductivity, and each having a different bandgap selected for absorbing radiation up to selected first wavelengths of $\lambda_{(y+1)}$, where y=0 or is an even number between 0 and n, in accordance with the value of y;

a second sequence of layers, interspersed with layers of said first sequence, each doped to provide a second type of electrical conductivity, and each having a different bandgap selected for absorbing radiation up to selected second wavelengths of $\lambda_{(z+1)}$ where z is an odd number from 1 to n−1, in accordance with the value of z, layers of the first sequence alternating with layers of the second sequence;

a third sequence of layers, each doped to provide the second type of electrical conductivity, interspersed between said first and second sequence of layers, each of said third sequence of layers having a bandgap substantially greater than its adjacent layer of said second sequence of layers; and terminals electrically coupled to each layer in said first sequence of layers to apply a bias to said first and second sequence of layers to permit detection of radiation in selected ones of the wavelength ranges $\lambda_0$-$\lambda_1$ to $\lambda_{n-1}$-$\lambda_n$, the number of terminals being determined by (n+1)/2.

It will be understood that, as each layer in the first and second sequences have different bandgaps, each layer will absorb radiation up to different wavelengths in the range $\lambda_0$-$\lambda_n$. In particular, for the first sequence of layers, the first layer absorbs radiation up to a wavelength $\lambda_1$, the second layer up to a wavelength of $\lambda_3$, and the nth layer upt a wavelength of $\lambda_{n+1}$. Similarly, for the second sequence of layers, the first layer absorbs radiation up to a wavelength $\lambda_2$, the second layer up to a wavelength of $\lambda_4$, and the nth layer upt a wavelength of $\lambda_n$.

It is preferred that the first sequence of layers is n-type material and said second sequence of layers is p-type material.

Preferably, in one embodiment wherein n=3, detection of radiation may be allowed in selected ones of the wavelength ranges $\lambda_0$-$\lambda_1$, $\lambda_1$-$\lambda_2$, $\lambda_2$-$\lambda_3$, $\lambda_0$-$\lambda_2$ and $\lambda_1$-$\lambda_3$. Alternatively, in another embodiment wherein n=5, detection of radiation may be allowed in selected ones of the wavelength ranges $\lambda_0$-$\lambda_1$, $\lambda_0$-$\lambda_2$, $\lambda_1$-$\lambda_2$, $\lambda_1$-$\lambda_3$, $\lambda_2$-$\lambda_3$, $\lambda_2$-$\lambda_4$, $\lambda_3$-$\lambda_4$, $\lambda_3$-$\lambda_5$ and $\lambda_4$-$\lambda_5$.

The semiconductor material may comprise Group II-VI semiconductor material. The semiconductor material may comprise cadmium mercury telluride ($Hg_{1-x}Cd_xTe$).

Advantageously, the substrate may comprise gallium arsenide, gallium arsenide on silicon, cadmium telluride, cadmium zinc telluride, cadmium telluride on silicon or cadmium telluride on sapphire.

Preferably, an anti-reflection coating may be disposed on a surface of the substrate, the substrate surface being a radiation-admitting surface of the detector.

In one embodiment, a lower limit $\lambda_0$ of the first wavelength range may be modified by the composition of a layer in the detector. Alternatively, a lower limit $\lambda_0$ of the first wavelength range may be modified by an optical filter.

Preferably, the electromagnetic radiation detector may be a photodiode.

BRIEF DESCRIPTION OF THE DRAWINGS

For a better understanding of the present invention, reference will now be made, by way of example only, to accompanying drawings in which:—

FIG. 2 is a cross-sectional view of a three-colour photon detector in accordance with the invention;

FIG. 3 is a schematic diagram of the three colour detector shown in FIG. 2;

FIGS. 4A to 4D are charts showing the effect of application of bias to junctions of the detector shown in FIGS. 2 and 3;

DETAILED DESCRIPTION

Figure 1:
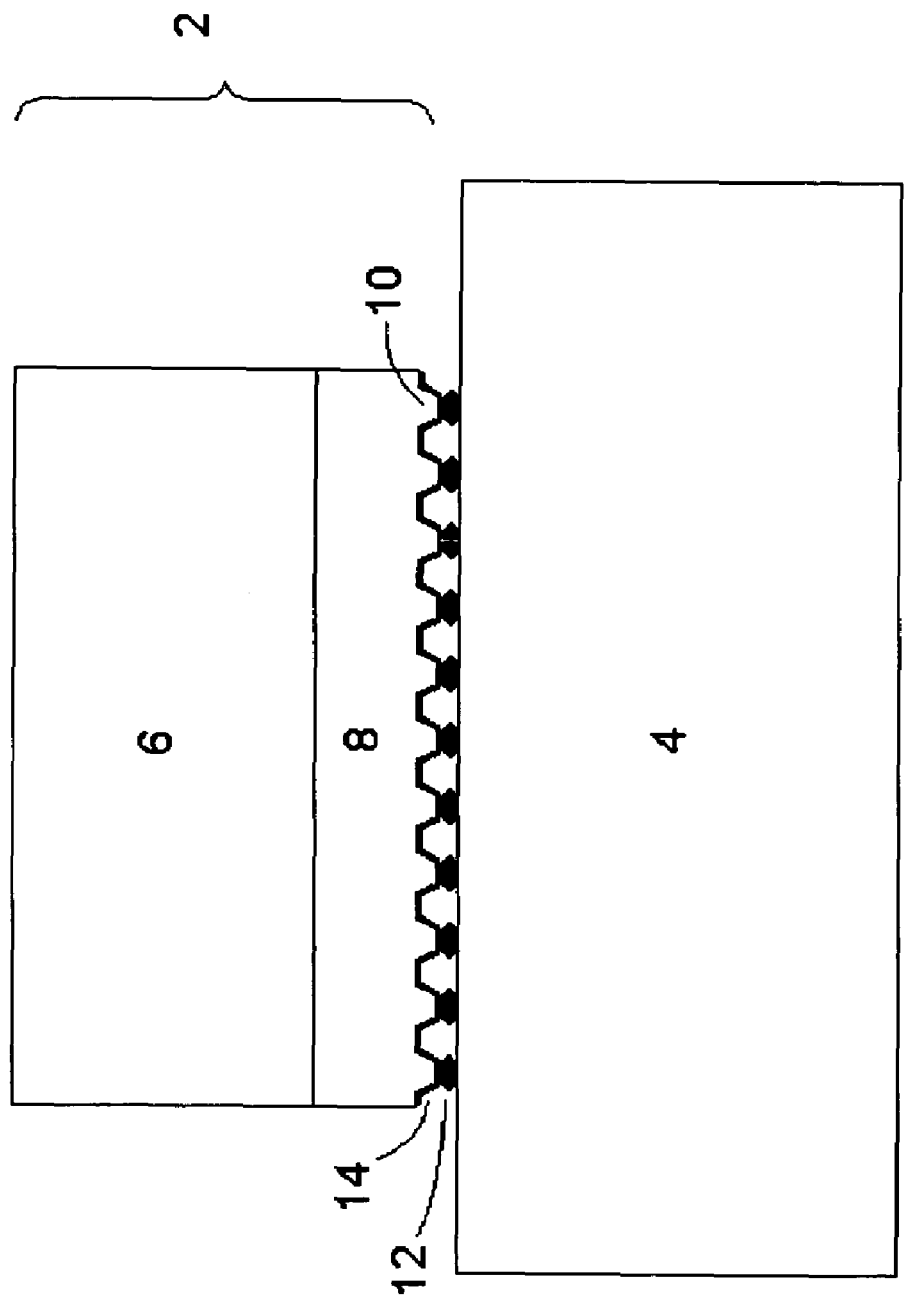
FIG. 1 generally shows a device in accordance with the invention bump-bonded to a silicon processor.

Referring initially to FIG. 1, a multi-colour photon detector 2 bump-bonded to a silicon processor 4 is shown. The detector 2 comprises a layer 8 of detector material attached to a substrate 6. Mesa structures 10 are formed in the detector material layer 8 to form a diode array and bumps 12 attach the detector 2 to the silicon processor 4 via each mesa 10. Exposed surfaces of the mesas 10 are covered with a passivation layer 14.

In FIG. 2, an enlarged view of one of the mesa structures 10 of FIG. 1 is shown. In this Figure, a three-colour photon detector includes substrate 6 on which the mesa-type multi-layered HgCdTe detector structure 10 is monolithically integrated. The detector may be grown by Liquid Phase Epitaxy (LPE), Molecular Beam Epitaxy (MBE), Vapour Phase Epitaxy (VPE) or by any process that is suitable for forming layers of $Hg_{1-x}Cd_xTe$, where the value of x is selected to set the bandgap energy of the $Hg_{1-x}Cd_xTe$ to provide the desired spectral response for a given layer.

The HgCdTe mesa structure 10 comprises a first layer 24 which is an n-type radiation absorbing layer, doped with, for example, iodine at a concentration of approximately $5 \times 10^{16}$ atoms.cm$^{-3}$. Overlying the first layer 24 is a p-type radiation absorbing layer 26 doped with, for example, approximately $3 \times 10^{17}$ atoms.cm$^{-3}$ of arsenic. Overlying absorbing layer 26 is a second layer of n-type radiation absorbing layer 28 doped with, for example, iodine at a concentration of approximately $5 \times 10^{16}$ atoms.cm$^{-3}$. The absorbing layers 24, 26, 28 must be thick enough to absorb most of the incident photons with energies greater than the bandgap. The required thickness can be roughly approximated as a thickness comparable to the wavelength of the photons being absorbed.

On either side of the second absorbing layer 26 is a barrier layer of p-type HgCdTe material 30, 32. The barrier layers 30, 32 are designed to prevent minority carriers generated by photons absorbed in the second absorbing layer 26 from escaping and appearing as a signal. The barrier layers 30, 32 must therefore be thick enough to prevent electrons tunnelling through. They are formed by increasing the bandgap at the interfaces between the absorbing layers 24, 26, 28. There are therefore two p-n junctions 34, 36 in the device, one at the interface between layers 24 and 30, the other at the interface between layers 32 and 28.

Most absorption occurs in the region of the absorbing layer on which the photons are incident. In the case of the first absorbing layer 24 (unlike the third absorbing layer 28), most absorption occurs in the region furthest from the junction 34. To ensure that the minority carriers (holes) photo-generated in the first absorbing layer 24 reach the p-n junction 34 before recombining, the diffusion length in the first absorbing layer 24 is designed to be greater than the thickness thereof. The diffusion length is controlled by the HgCdTe composition and the doping. The HgCdTe composition is fixed by the wavelengths to be detected so the doping level is chosen to give the required diffusion length.

On the other hand, the second absorbing layer 26 is heavily doped to minimise the minority carrier (electron) lifetime. To prevent the photons absorbed in the second absorbing layer 26 from producing a signal at the detector output, the photo-generated electrons in the second absorbing layer 26 are required to recombine as quickly as possible. The barrier layers 30, 32 on either side of absorbing layer 26 prevent the electrons that do not recombine from escaping.

Overlying exposed surfaces of the mesa structure 10 is an electrically insulating dielectric layer, preferably a wide bandgap passivation layer 14, such as a layer of cadmium telluride, CdTe, or zinc sulphide, ZnS. The passivation layer 14 beneficially reduces surface states by electronically combining with the states making them unavailable for surface conduction and improves the signal-to-noise ratio of the detector by reducing surface leakage currents. A suitable thickness for the passivation layer is between approximately 0.3 μm and 0.9 μm. Too thick a layer may stress the underlying HgCdTe and thereby affect the diode performance. With too thin a layer, the required signal-to-noise ratio may not be attained.

The substrate 6 is formed of, for example, gallium arsenide GaAs, epitaxial GaAs on silicon (GaAs:Si), CdZnTe, CdTe, CdTe:Si or CdTe:sapphire or other material that is substantially transparent to radiation having wavelengths of interest. In operation, radiation is incident upon a bottom surface 42 of the substrate 6. An anti-reflection coating may be applied to the bottom surface 42 of the substrate 6 to improve efficiency.

Within the substrate a common layer 44 of n-type electrical conductivity is formed. The interface between the common layer 44 and the first absorbing layer 24 is aligned with the base of the mesa. If the diffusion length in the first absorbing layer 24 is large compared with the distance between pixels (the array pitch), the etches between mesas (slots) need to penetrate the interface to prevent cross-talk, i.e. holes generated in the first absorbing layer 24 of one pixel leaking into the first absorbing layer of an adjacent pixel.

The substrate 6 defines the cut-on wavelength band to be detected by the detector 2, that is, $\lambda_0$.

A bump 12 of indium or other suitable material is used to bond each mesa 10 to the silicon processor 4 via a window 40 etched in the passivation layer 14. Another metal may be deposited between the indium and the HgCdTe of absorbing layer 28 to reduce the possibility of unwanted interdiffusion between the indium and the HgCdTe.

In the two-colour mode of operation, a suitable bias potential is applied between the common layer 44 and the bump 12 (FIG. 1). A low negative bias is applied between the layers 24 and 26 to detect radiation in the wavelength range $\lambda_0$-$\lambda_1$, and a low positive bias is applied between the layers 26 and 28 to detect radiation in the wavelength range $\lambda_2$-$\lambda_3$.

Photocurrents from the detector 2 are read out using a multiplexer or Read Out Integrated Circuit (ROIC) (not shown). An ROIC is a silicon integrated circuit designed for this purpose. For each diode in the array, there is a corresponding input circuit in the ROIC, and the indium bumps 12 are used to connect each diode to its corresponding input circuit. Each input circuit has a capacitor that stores photocurrent collected over a defined time period. The stored charges are then read out row by row and subsequently processed as required.

The metal organic vapour phase epitaxy (MOVPE) growth system used to grow the epitaxial layers of the mesa array cannot generate sharp arsenic concentration steps as arsenic diffuses significantly at the growth temperature. Spacer layers, not shown in FIG. 2, are used to ensure that, when allowance is made for diffusion of the arsenic, the junctions are formed in the required position.

The mesas 10 are formed by defining a slot pattern in photoresist on the HgCdTe layers using photolithography and etching away the exposed HgCdTe to form slots. Such etches are isotropic (i.e. the etch goes sideways under the resist mask as well as down) and therefore the deeper the etch, the smaller the top of the mesa 10. As the top of each mesa is required to carry an indium bump, there is a limit to the thickness of the HgCdTe layers. Typically, the mesa depth is approximately 8.5 μm with an array pitch of approximately 30 μm, although other depths and pitches are possible.

The photoresist is removed and the passivation layer 14 is deposited. Contact windows are defined in photoresist using photolithography, the passivation is etched away in the contact windows and the photoresist removed. Alternatively, a 'lift-off' process is used to define the contact windows. In the process, photolithography is used to place resist dots on the mesa tops, the passivation layer is deposited and the resist is then dissolved to lift-off the passivation on the resist dots. Similar processes are used to form the metal contacts to the mesa dots 41 and to the common layer and to form the indium bump interconnects. The wafer is then cut into die, each die being an array ready for bump-bonding to a multiplexer.

Operation of a three-colour mode of operation will now be described with reference to FIG. 3. Components that perform the same function as those of FIG. 2 are referenced alike albeit they have different nomenclature.

In FIG. 3, the mesa 10 is shown diagrammatically for ease of explanation. The absorbing layer 24 has a contact or terminal 44 that is equivalent to the common layer 44 in FIG. 2 and the absorbing layer 28 has a contact or terminal 40 that is equivalent to the window 40 in FIG. 2. Radiation to be detected is incident on the substrate 6 (not shown in FIG. 3). Photons that pass through the substrate 6 are incident on the first absorbing 24 layer where they are absorbed if they have wavelengths less than $\lambda_1$. Photons with wavelengths longer than $\lambda_1$ pass through the first absorbing layer 24 and are incident on the second absorbing layer 26 where they are absorbed if they have wavelengths less than $\lambda_2$. Photons with wavelengths longer than 2 pass through the second absorbing layer 26 and are incident on the third absorbing layer 28 where they are absorbed if they have wavelengths less than 3. Thus, electron-hole pairs generated in the first absorbing layer 24 are due to photons with wavelengths between $\lambda_0$ and $\lambda_1$, those generated in the second absorbing layer 26 are due to photons with wavelengths between $\lambda_1$ and $\lambda_2$, and those generated in the third absorbing layer 28 are due to photons with wavelengths between $\lambda_2$ and $\lambda_3$.

Depending on the bias that is applied to the detector 2 between the common layer 44 and the window 40, different wavelength ranges $\lambda_0$-$\lambda_1$, $\lambda_0$-$\lambda_2$. $\lambda_1$-$\lambda_3$ and $\lambda_2$-$\lambda_3$ can be detected in the overall wavelength range of $\lambda_0$-$\lambda_3$. Furthermore, wavelength range $\lambda_1$-$\lambda_2$ can be derived from wavelength ranges $\lambda_0$-$\lambda_1$ and $\lambda_0$-$\lambda_2$.

When a low voltage is applied between the first and third absorbing layers 24 and 28, such that the junction between the first and second absorbing layers 24 and 26 is in reverse bias and the junction between the second and third absorbing layers 26 and 28 is in forward bias:— carriers generated in the first absorbing layer 24 are separated at the reverse biased junction and appear as a photocurrent in the external circuit;

carriers generated in the second absorbing layer 26 are unable to reach either junction due to the barrier layers 30 and 32 so they recombine in the second absorbing layer 26 and do not give rise to a photocurrent in the external circuit;

carriers generated in the third absorbing layer 28 are not separated at the forward biased junction and do not appear as a photocurrent in the external circuit.

The net result is that the photocurrent is due only to photons with wavelengths between $\lambda_0$ and $\lambda_1$. This is shown in FIG. 4A.

When a high voltage is applied between the first and third absorbing layers 24 and 28, such that the junction between the first and second absorbing layers 24 and 26 is in reverse bias, the junction between the second and third absorbing layers 26 and 28 is in forward bias, and the barrier layer 30 between the first and second absorbing layers 24 and 26 is pulled down:

carriers generated in the first absorbing layer 24 are separated at the reverse biased junction and appear as a photocurrent in the external circuit;

carriers generated in the second absorbing layer 26 are separated at the reverse biased junction and appear as a photocurrent in the external circuit;

carriers generated in the third absorbing layer 28 are not separated at the forward biased junction and do not appear as a photocurrent in the external circuit.

The net result is that the photocurrent is due to photons with wavelengths between $\lambda_0$ and $\lambda_2$. This is shown in FIG. 4C.

When a low voltage is applied between the first and third absorbing layers 24 and 28, such that the junction between the first and second absorbing layers 24 and 26 is in forward bias and the junction between the second and third absorbing layers 26 and 28 is in reverse bias:— carriers generated in the first absorbing layer 24 are not separated at the forward biased junction and do not appear as a photocurrent in the external circuit;

carriers generated in the second absorbing layer 26 are unable to reach either junction due to the barrier layer 30 and 32 so they recombine in the second absorbing layer 26 and do not give rise to a photocurrent in the external circuit;

carriers generated in the third absorbing layer 28 are separated at the reverse biased junction and appear as a photocurrent in the external circuit.

The net result is that the photocurrent is due only to photons with wavelengths between $\lambda_2$ and $\lambda_3$. This is illustrated in FIG. 4B.

When a high voltage is applied between the first and third absorbing layers 24 and 28, such that the junction between the first and second absorbing layers 24 and 26 is in forward bias, the junction between the second and third absorbing layers 26 and 28 is in reverse bias, and the barrier layer 32 between the second and third absorbing layer 26 and 28 is pulled down:— carriers generated in the first absorbing layer 24 are not separated at the forward biased junction and do not appear as a photocurrent in the external circuit;

carriers generated in the second absorbing layer 26 are separated at the reverse biased junction and appear as a photocurrent in the external circuit;

carriers generated in the third absorbing layer 28 are separated at the reverse biased junction and appear as a photocurrent in the external circuit.

The net result is that the photocurrent is due to photons with wavelengths between $\lambda_1$ and $\lambda_3$. This is shown in FIG. 4D.

The signals obtained under the high and low bias states can be subtracted in an external signal processing unit to give outputs that are proportional to the photon flux in the wavelength ranges $\lambda_1$-$\lambda_2$. The net result is a two terminal device that can give information of three adjacent colours; i.e. $\lambda_0$-$\lambda_1$, $\lambda_1$-$\lambda_2$, and $\lambda_2$-$\lambda_3$.

Figure 5:
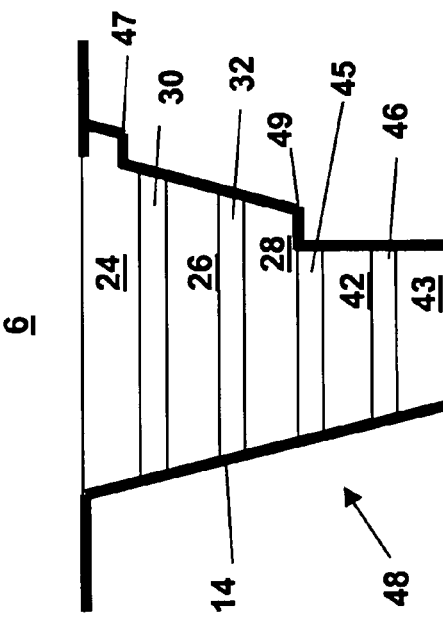
FIG. 5 is a cross-sectional view, similar to that of FIG. 3, of a five-colour photon detector in accordance with the invention.
Figure 6:
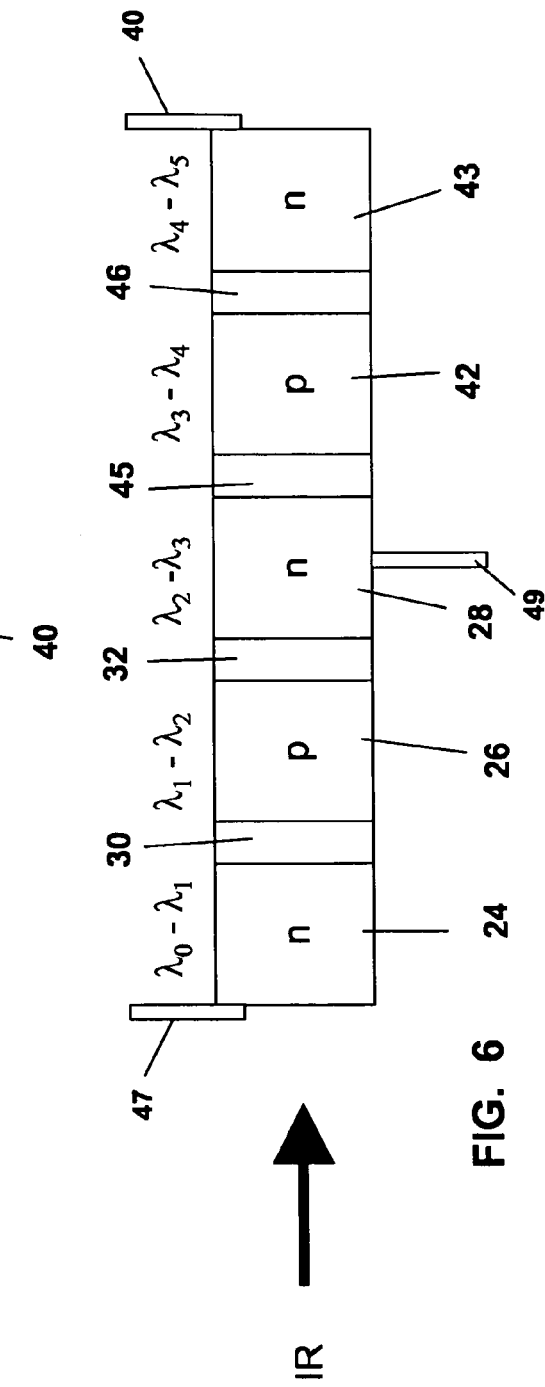
FIG. 6 is a schematic diagram of the five colour detector shown in FIG. 5.

Referring now to FIGS. 5 and 6, a detector structure is shown that has the capability of detecting five wavelength ranges. This detector is substantially similar to that shown in FIGS. 2 and 3, and to the extent that it is, like elements are designated by the same reference numerals as in FIGS. 2 and 3.

In FIGS. 5 and 6, additional fourth and fifth absorbing layers 42 and 43 are provided between the absorbing layer 28 and the passivation layer 14 at the summit of mesa 48. The fourth absorbing layer 42 is a p-type radiation absorbing layer similar to the second absorbing layer 26, and is doped with, for example, arsenic, while the fifth absorbing layer 43 is an n-type radiation absorbing layer, similar to absorbing layers 24 and 28, and doped for example with iodine. In both cases at concentrations of the doping material are dictated by the wavelength of the radiation to be absorbed by that layer.

Interposed between the third absorbing layer 28 and the fourth absorbing layer 42, and between the fourth absorbing layer 42 and the fifth absorbing layer 43 are barrier layers 45, 46 of p-type HgCdTe material, designed, as with barrier layers 30 and 32, to prevent the carriers generated by photons absorbed in the fourth absorbing layer 42 from escaping and appearing as a signal. As before, with the barrier layers 30 and 32, the barrier layers 45 and 46 must therefore be thick enough to prevent electrons tunnelling through. As before, they are formed by increasing the bandgap at the interfaces between the absorbing layers 28, 42, 43, thereby forming two further p-n junctions in the device, one at the interface between layers 28 and 45 and another at the interface between layers 46 and 43.

The absorbing layer 28 is in contact with the processor 4 via a contact or terminal 49 while the absorbing layer 43, which is covered by the passivation layer 14 with a window 40 therein, is in electrical contact with the processor 6 in a similar way to that described with reference to the three-colour detector of FIG. 2.

It is to be noted that, in FIG. 5, the mesa 48 has a slightly different shape to the mesa 10 of FIG. 2. Here, the mesa 48 has a first land formed in the first absorbing layer 24 so that a contact or terminal 47 can be provided in that layer. A second land is formed in the third absorbing layer 28 so that contact or terminal 49 can be provided in that layer.

In the five-colour detector shown in FIGS. 5 and 6, contact or terminal 49 is common and there is no common layer 44 in the substrate 6. This means that the first to third absorbing layers 24, 26 and 28 can be considered to effectively form one three-colour detector. Similarly, the third to fifth absorbing layers 28, 42 and 43 can be considered to effectively form a second three-colour detector. The operation of each "three-colour detector" within the five-colour detector operates in the same way to that described with reference to FIGS. 2 and 3 but for different wavelength ranges.

Due to the slightly different construction of mesa 48, tracks (not shown) are formed over the passivation layer 14 so that contact or terminal 49 can be connected to tracks formed in slots (not shown) between the mesas in the array defining the common (also not shown).

A track (not shown) is also formed over the passivation layer 14 from the contact or terminal 47 on the first land to a second bump (also not shown) Formed adjacent window 40 for connection to the processor 4 (FIG. 1). In this case, the layer adjacent the mesas 48 comprises a wide-gap insulator.

For a five-colour detector, in addition to the first, second and third absorbing layers 24, 26 and 28 detecting photons with wavelengths between $\lambda_0$ and $\lambda_1$ (first layer 24), $\lambda_1$ and $\lambda_2$ (second layer 26) and $\lambda_2$ and $\lambda_3$ (third layer 28) as described above with reference to FIGS. 2 and 3, electron-hole pairs generated in the fourth absorbing layer 42 are due to photons with wavelengths between $\lambda_3$ and $\lambda_4$, and those generated in the fifth absorbing layer 43 are due to photons with wavelengths between $\lambda_4$ and $\lambda_5$.

Bias voltages applied between the first and third absorbing layers 24 and 28 via contacts (or terminals) 47 and 49 give outputs due to photons in the band $\lambda_0$-$\lambda_1$, $\lambda_0$-$\lambda_2$, $\lambda_2$-$\lambda_3$, and $\lambda_1$-$\lambda_3$, and bias voltages applied between the third and fifth absorbing layers 28 and 43 via contacts (or terminals) 49 and 40 give outputs due to photons in the bands $\lambda_2$-$\lambda_3$, $\lambda_2$-$\lambda_4$, $\lambda_4$-$\lambda_5$, and $\lambda_3$-$\lambda_5$. As before, by subtraction, the wavelength band $\lambda_3$-$\lambda_4$ is derived from $\lambda_3$-$\lambda_5$ and $\lambda_4$-$\lambda_5$ or $\lambda_2$-$\lambda_4$ and $\lambda_2$-$\lambda_3$ and the five-colour device can provide information about five adjacent colours or wavelength ranges $\lambda_0$-$\lambda_1$, $\lambda_1$-$\lambda_2$, $\lambda_2$-$\lambda_3$, $\lambda_3$-$\lambda_4$ and $\lambda_4$-$\lambda_5$ in an overall wavelength range of $\lambda_0$-$\lambda_5$.

Whilst the three-colour detector can detect only one of the three colours at a time, the five-colour detector can detect two colours at a time.

By rapid switching of the bias applied to the three- or five-colour detector, the other colours can be detected.

Examples of the useable colours obtainable from three- and five-colour detectors are shown in Table 1. All wavelengths are in μm.

TABLE 1

| Device type | $\lambda_0$ | $\lambda_1$ | $\lambda_2$ | $\lambda_3$ | $\lambda_4$ | $\lambda_5$ | Useable colours |
|---|---|---|---|---|---|---|---|
| 2 terminal | 2.0 | 2.5 | 3.5 | 4.5 | — | — | 3 MW |
|  | 8.0 | 8.5 | 9.0 | 9.5 | — | — | 3 LW |
| 3 terminal | 2.0 | 3.0 | 4.0 | 5.0 | 8.0 | 10.0 | 3 MW and 1 LW |
|  | 2.0 | 3.0 | 5.0 | 8.0 | 9.0 | 10.0 | 2 MW and 2 LW |
|  | 2.5 | 3.0 | 3.5 | 4.0 | 4.5 | 5.0 | 5 MW |
|  | 8.0 | 8.5 | 9.0 | 9.5 | 10.0 | 10.5 | 5 LW |

The first two examples give three wavelength ranges in the MW and LW regions respectively. The other three examples give five wavelength ranges in either the LW region only (last example), the MW region only (fifth example) or a combination of LW and MW regions (third and fourth examples). The wavelength ranges can readily be deduced from the values given in Table 1.

However, it is to be noted that in the first two examples for a five-colour detector, the wavelength ranges between 5.0 and 8 μm have been excluded as these are not suitable for terrestrial use due to strong atmospheric absorption between these values. This means that the five-colour detector can only detect four useable bands, 3MW, 1LW and 2MW, 2LW when looking at an overall wavelength band of 2 to 10 μm, for example.

It will be clearly appreciated that the present invention can be extended by application of additional layers to detect a larger number (n) of wavelength ranges than described herein provided that the physical parameters of mesa creation permit. For example, for each additional p-type/n-type radiation absorbing layer pair to that of the five-colour detector, an additional land is required in the mesa to accommodate a contact or terminal for the additional n-type radiation absorbing layer.

It will be noted that for each (2d+1)-colour detector (where d=1, 2, ..., n), only (d+1) contacts (or terminals) are required. [Alternatively, for each n-colour detector, where n≧3 and is odd, the number of contacts or terminals is (n+1)/2.] This has the advantage that the HgCdTe detector is not difficult to make as there are fewer terminals and the read-out/processing circuitry is simpler to implement.

Having now described embodiments of the invention, numerous modifications will become apparent to the skilled person. For example, the cut-on for wavelength band $\lambda_0$ could be set by a suitable optical filter rather than or in addition to the composition of the common layer 44. The first absorbing layer 24 may be p-type HgCdTe in which case the p-n junction is between the first absorbing layer 24 and the common layer 44. It is therefore preferable to etch the slot depth into the common layer 44 to prevent electrical cross-talk between adjacent pixels.

The invention claimed is:

1. An electromagnetic radiation detector responsive to n discrete wavelength ranges, where n is odd and greater than or equal to 3, characterised as $\lambda_0$-$\lambda_1$, $\lambda_1$-$\lambda_2$, ..., $\lambda_{n-1}$-$\lambda_n$ within a total wavelength range $\lambda_0$-$\lambda_n$ where $\lambda_0 < \lambda_1 < \lambda_2 < ... \lambda_{n-1} < \lambda_n$, the detector comprising a plurality of layers of semiconductor material providing:

a substrate substantially transparent to electromagnetic radiation within said wavelength range $\lambda_0$-$\lambda_n$;

a first sequence of layers, each doped to provide a first type of electrical conductivity, and each having a different bandgap selected for absorbing radiation up to selected first wavelengths of $\lambda_{(y+1)}$, where y=0 or is an even number between 0 and n, in accordance with the value of y;

a second sequence of layers, interspersed with layers of said first sequence, each doped to provide a second type of electrical conductivity, and each having a different bandgap selected for absorbing radiation up to selected second wavelengths of $\lambda_{(z+1)}$, where z is an odd number from 1 to n−1, in accordance with the value of z, layers of the first sequence alternating with layers of the second sequence;

a third sequence of layers, each doped to provide the second type of electrical conductivity, interspersed between said first and second sequence of layers, each of said third sequence of layers, having a bandgap substantially greater than its adjacent layer of said second sequence of layers; and terminals electrically coupled to each layer in said first sequence of layers to apply a bias to said first and second sequence of layers to permit detection of radiation in selected ones of the wavelength ranges $\lambda_0$-$\lambda_1$ to $\lambda_{n-1}$-$\lambda_n$, the number of terminals being determined by (n+1)/2.

2. A detector according to claim 1, wherein the first sequence of layers is n-type material and said second sequence of layers is p-type material.

3. A detector according to claim 1, wherein n=3 and detection of radiation is allowed in selected ones of the wavelength ranges $\lambda_0$-$\lambda_1$, $\lambda_1$-$\lambda_2$, $\lambda_2$-$\lambda_3$, $\lambda_0$-$\lambda_2$ and $\lambda_1$-$\lambda_3$.

4. A detector according to claim 1, wherein n=5 and detection of radiation is allowed in selected ones of the wavelength ranges $\lambda_0$-$\lambda_1$, $\lambda_0$-$\lambda_2$, $\lambda_1$-$\lambda_2$, $\lambda_1$-$\lambda_3$, $\lambda_2$-$\lambda_3$, $\lambda_2$-$\lambda_4$, $\lambda_3$-$\lambda_4$, $\lambda_3$-$\lambda_5$ and $\lambda_4$-$\lambda_5$.

5. A detector according to claim 1, wherein the semiconductor material comprises Group II-VI semiconductor material.

6. A detector according to claim 5, wherein the semiconductor material comprises cadmium mercury telluride ($Hg_{1-x}Cd_xTe$).

7. A detector according to claim 1, wherein the substrate comprises gallium arsenide, gallium arsenide on silicon, cadmium telluride, cadmium zinc telluride, cadmium telluride on silicon or cadmium telluride on sapphire.

8. A detector according to claim 1, further comprising an anti-reflection coating disposed on a surface of the substrate, the substrate surface being a radiation-admitting surface of the detector.

9. A detector according to claim 1, wherein a lower limit $\lambda_0$ of the first wavelength range is modified by the composition of a layer in the detector.

10. A detector according to claim 1, wherein a lower limit $\lambda_0$ of the first wavelength range is modified by an optical filter.

11. A detector according to claim 1, wherein the electromagnetic radiation detector is a photodiode.

12. A detector according to claim 2, wherein n=3 and detection of radiation is allowed in selected ones of the wavelength ranges $\lambda_0$-$\lambda_1$, $\lambda_1$-$\lambda_2$, $\lambda_2$-$\lambda_3$, $\lambda_0$-$\lambda_2$ and $\lambda_1$-$\lambda_3$.

13. A detector according to claim 2, wherein n=5 and detection of radiation is allowed in selected ones of the wavelength ranges $\lambda_0$-$\lambda_1$, $\lambda_0$-$\lambda_2$, $\lambda_1$-$\lambda_2$, $\lambda_1$-$\lambda_3$, $\lambda_2$-$\lambda_3$, $\lambda_2$-$\lambda_4$, $\lambda_3$-$\lambda_4$, $\lambda_3$-$\lambda_5$ and $\lambda_4$-$\lambda_5$.

* * * * *